United States Patent
Liu (10) Patent No.: US 8,928,831 B2
(45) Date of Patent: Jan. 6, 2015

(54) TFT-LCD ARRAY SUBSTRATE AND MANUFACTURING METHOD THEREOF

(71) Applicant: Beijing Boe Optoelectronics Technology Co., Ltd., Beijing (CN)

(72) Inventor: Xiang Liu, Beijing (CN)

(73) Assignee: Beijing Boe Optoelectronics Technology Co., Ltd., Beijing (CN)

( * ) Notice: Subject to any disclaimer, the term of this patent is extended or adjusted under 35 U.S.C. 154(b) by 0 days.

(21) Appl. No.: 13/742,785

(22) Filed: Jan. 16, 2013

(65) Prior Publication Data

US 2013/0146880 A1    Jun. 13, 2013

Related U.S. Application Data

(62) Division of application No. 12/778,271, filed on May 12, 2010, now Pat. No. 8,379,162.

(30) Foreign Application Priority Data

May 13, 2009    (CN) .......................... 2009 1 0083981

(51) Int. Cl.
    *G02F 1/136*  (2006.01)
    *H01L 27/15*  (2006.01)
    *H01L 29/786*  (2006.01)
    *H01L 27/12*  (2006.01)
    *H01L 29/66*  (2006.01)
    *G02F 1/1362*  (2006.01)

(52) U.S. Cl.
    CPC .. *H01L 27/156* (2013.01); *G02F 2001/136236* (2013.01); *H01L 29/78633* (2013.01); *H01L 27/12* (2013.01); *H01L 29/66765* (2013.01); *H01L 27/1214* (2013.01); *G02F 1/1362* (2013.01)
    USPC .......................................................... 349/44

(58) Field of Classification Search
    CPC .................................................. G02F 1/133512
    USPC .......................................................... 349/44
    See application file for complete search history.

(56) References Cited

U.S. PATENT DOCUMENTS 6,972,821 B2 * 12/2005 Yasuda et al. ................. 349/155
7,167,218 B1    1/2007 Park et al.
7,804,097 B2    9/2010 Kang et al.
(Continued)

FOREIGN PATENT DOCUMENTS

JP    08-338998 A    12/1996
JP    2002-250913 A    9/2002
KR    20050009039 A    1/2005

OTHER PUBLICATIONS

USPTO RR dated Mar. 7, 2012 in connection with U.S. Appl. No. 12/778,271.

(Continued)

*Primary Examiner* — Eric Wong
(74) *Attorney, Agent, or Firm* — Ladas & Parry LLP (57) ABSTRACT

A thin film transistor liquid crystal display (TFT-LCD) array substrate and a manufacturing method thereof are provided. The TFT-LCD array substrate comprises a gate line and a data line. A pixel electrode and a thin film transistor (TFT) are formed in a pixel region defined by intersecting of the gate line and the data line. A light-blocking layer is formed over a TFT channel region of the thin film transistor.

7 Claims, 9 Drawing Sheets

(56) References Cited

U.S. PATENT DOCUMENTS

| | | |
|---|---|---|
| 2006/0139548 A1 | 6/2006 | Ahn |
| 2007/0166859 A1 | 7/2007 | Lee et al. |
| 2009/0263921 A1 * | 10/2009 | Lee et al. ............... 438/29 |
| 2012/0034722 A1 | 2/2012 | Qiu et al. |

OTHER PUBLICATIONS

USPTO NFOA dated May 17, 2012 in connection with U.S. Appl. No. 12/778,271.

USPTO NOA mailed Oct. 18, 2012 in connection with U.S. Appl. No. 12/778,271.

* cited by examiner

Gate Pad Area

Fig.16

Data Pad Area

TFT-LCD ARRAY SUBSTRATE AND MANUFACTURING METHOD THEREOF

BACKGROUND

Embodiments of the invention relate to a thin film transistor liquid crystal display (TFT-LCD) array substrate and a manufacturing method thereof.

Thin film transistor liquid crystal displays (TFT-LCDs) have the advantages of small volume, low energy consumption, low radiation, and etc., and thus prevail in the flat panel display market. A liquid crystal panel is one of the most important components in one TFT-LCD and comprises an array substrate and a color filter substrate, which are assembled together with a liquid crystal layer disposed therebetween. At present, the array substrate is prepared by forming structural patterns by a series of patterning processes. One structural pattern layer can be formed by one patterning process. The array substrate and the manufacture process thereof are critical to the properties, yield and price of the TFT-LCD. In order to effectively decrease the price and increase the yield, the process of manufacturing the TFT-LCD array substrate was gradually simplified. Specifically, the process of manufacturing the array substrate has been developed from a 7-mask process to a 4-mask process by using a half-tone or gray-tone mask.

In a conventional TFT-LCD, a black matrix for blocking leakage light may be provided on the color filter substrate. The black matrix is typically made of opaque metal film of chromium (Cr). Since the metal film of Cr has a high reflectivity to light, the light from backlight can be reflected by the metal film of Cr when it is irradiated on the color filter substrate, and a portion of the reflected light is then irradiated on the semiconductor layer of the TFT channel region. The semiconductor layer is formed of photosensitive material, thus leakage current is generated when the semiconductor layer is irradiated by the reflected light. Because of such leakage current, the turn-off current $I_{off}$ is increased so that the retention period of the pixel charges is decreased. Therefore, the gray level change is adversely influenced, and to a severe degree, flickers occur in the display image.

According to the formula of calculating storage capacitance, the storage capacitance per unit area is inversely proportional to the gap between two plates. That is, the larger the gap is, the smaller the storage capacitance per unit area is. In the conventional TFT-LCD, the gate line or the common electrode line in the same layer as the gate line is used as one plate of the storage capacitor, and the pixel electrode formed on the passivation layer is used as the other plate of the storage capacitor, and the gap between two plates of the storage capacitor equals to the sum of the thicknesses of the gate insulating layer and the passivation layer and thus is relatively large. Therefore, the storage capacitance per unit area in the conventional TFT-LCD is relatively small.

SUMMARY

According to an embodiment of the invention, a TFT-LCD array substrate is provided. The TFT-LCD array substrate comprises a gate line and a data line, and a pixel electrode and a thin film transistor (TFT), which are formed in a pixel region defined by intersecting of the gate line and the data line. A light-blocking layer is formed over a TFT channel region of the thin film transistor.

According to another embodiment of the invention, a method of manufacturing a TFT-LCD array substrate is further provided in the invention. The method comprises the following steps: step 1 of forming a gate metal film on a substrate and patterning the gate metal film to form a gate line and a gate electrode; step 2 of sequentially depositing a gate insulating film, a semiconductor film and a doped semiconductor film on the substrate after step 1 and patterning the stacked semiconductor film and the doped semiconductor film to form an active layer; step 3 of sequentially depositing a transparent conductive film and a source/drain metal film on the substrate after step 2, and patterning the transparent conductive film and the source/drain metal film to form a pixel electrode, a data line, a source electrode, a drain electrode and a TFT channel region with a first half-tone mask or a first gray-tone mask, wherein the pixel electrode is directly connected with the drain electrode; and step 4 of depositing a passivation layer and a light-blocking film on the substrate after step 3, and patterning the passivation layer and the light-blocking film to form a light-blocking layer, a gate pad via hole and a data pad via hole by a patterning process with a second half-tone mask or a second gray-tone mask, wherein the light-blocking layer is positioned over the TFT channel region.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the following detailed description.

BRIEF DESCRIPTION OF THE DRAWINGS

The present invention will become more fully understood from the detailed description given hereinafter and the accompanying drawings which are given by way of illustration only, and thus are not limitative of the present invention and wherein.

DESCRIPTION OF THE EMBODIMENTS

Hereinafter, the embodiments of the invention will be described in detail with reference to the accompanying drawings.

Figure 1:
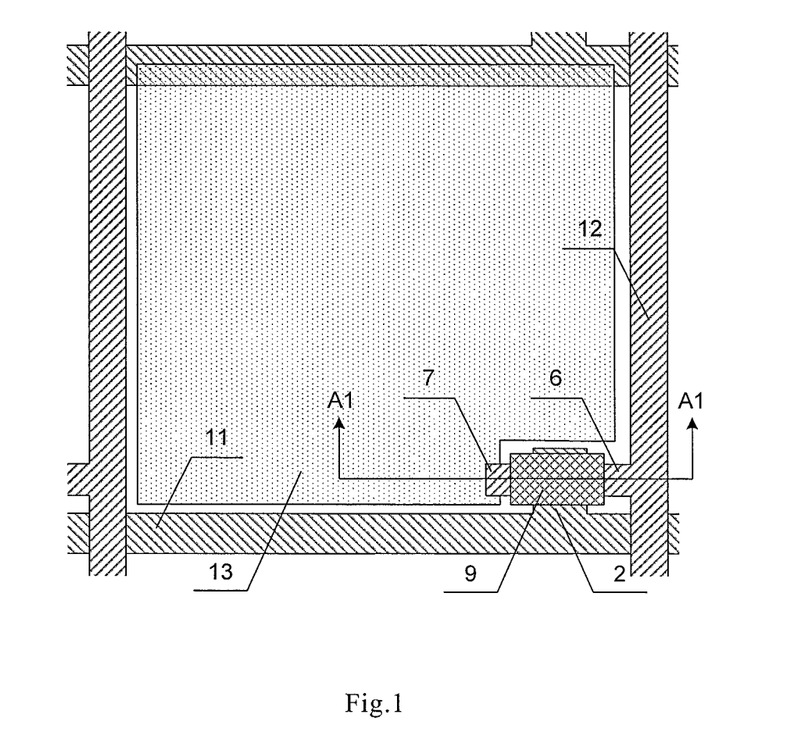
FIG. 1 is a plan view showing a TFT-LCD array substrate according to a first embodiment of the invention.
Figure 2:
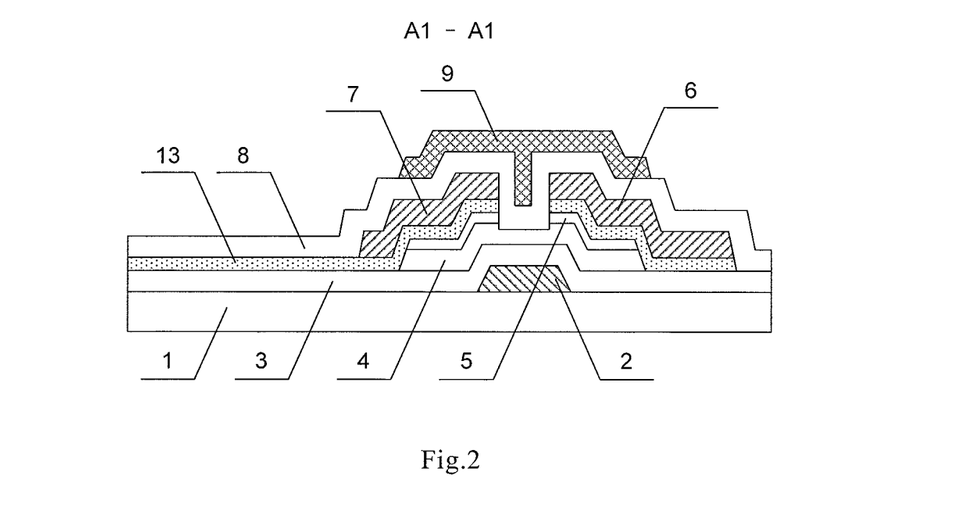
FIG. 2 is a sectional view taken along line A1-A1 in FIG. 1.

FIG. 1 is a plan view showing a TFT-LCD array substrate according to a first embodiment of the invention, in which one pixel region is shown. FIG. 2 is a sectional view taken along line A1-A1 in FIG. 1. As shown in FIG. 1 and FIG. 2, the TFT-LCD array substrate in the embodiment mainly comprises a gate line 11, a data line 12, a pixel electrode 13 and a thin film transistor. Pixel regions are defined by intersecting the gate line 11 and the data line 12. The thin film transistor and the pixel electrode 13 are formed in each of the pixel regions, and the thin film transistor is adjacent to the intersection of the gate line 11 and the data line 12. The gate line 11 is used to supply the turn-on signal to the thin film transistor, and the data line 12 is used to supply the data signal to the pixel electrode via the thin film transistor.

Specifically, in the TFT-LCD array substrate of the embodiment, the gate line 11 and a gate electrode 2 protruding from the gate line 11 are formed on a substrate 1, and a gate insulating layer 3 is formed on the gate line 11 and the gate electrode 2 and covers the entirety of the substrate 1. An active layer (comprising a semiconductor layer 4 and a doped semiconductor layer 5) is formed on the gate insulating layer 3 and positioned over the gate electrode 2. The pixel electrode 13 is formed on the gate insulating layer 3 and constitutes a storage capacitor together with a portion of the gate line 11, thus the structure in which the storage capacitor is on the gate line (Cs on Gate) is formed. One end of a source electrode 6 of the thin film transistor is provided on the active layer, and the other end thereof is connected with the data line 12. One end of a drain electrode 7 of the thin film transistor is provided on the active layer, and the other end thereof is connected with the pixel electrode 13. A TFT channel region is formed between the source electrode 6 and the drain electrode 7. In the TFT channel region, the doped semiconductor layer 5 is removed and the semiconductor layer 4 is partially removed in the thickness direction thereof so that the semiconductor layer 4 is exposed. A passivation layer 8 is formed on the source electrode 6, the drain electrode 7, the data line 12 and the pixel electrode 13 to cover the entirety of the substrate 1. A light-blocking layer 9 is formed on the passivation layer 8 and positioned over the TFT channel region. The light-blocking layer 9 is used to prevent light from being irradiated on the semiconductor layer in the TFT channel region, so that the leakage current resulting from the light irradiation can be avoided.

In the above structure of the embodiment, the pixel electrode 13, the data line 12, the source electrode 6 and the drain electrode 7 can be formed in a same patterning process. Specifically, a transparent conductive film 21 is remained beneath the data line 12, the source electrode 6 and the drain electrode 7, and the transparent conductive film beneath the drain electrode 7 is integrally formed with the pixel electrode 13. Thus, a structure in which the pixel electrode 13 is directly connected with the drain electrode 7 is formed.

FIG. 3 to FIG. 28 are schematic views showing the manufacture process of the TFT-LCD array substrate according to the first embodiment of the invention. In the following descriptions, a patterning process may comprises the processes of applying photoresist, masking, exposing and developing the photoresist to form a photoresist pattern, etching with the photoresist pattern, removing the photoresist layer and the like. A positive photoresist is used as an example of the photoresist.

Figure 3:
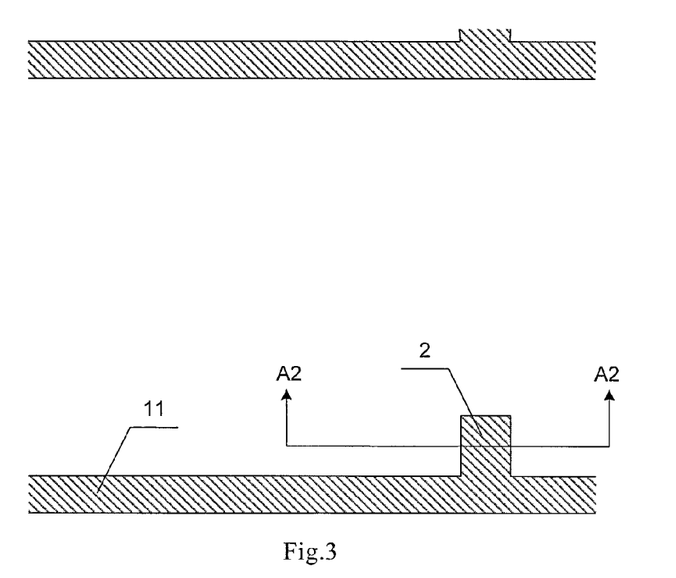
FIG. 3 is a plan view after a first patterning process of the TFT-LCD array substrate according to the first embodiment of the invention.
Figure 4:
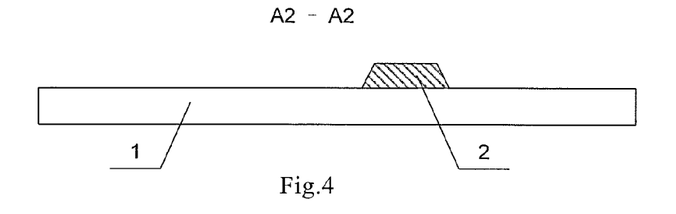
FIG. 4 is a sectional view taken along line A2-A2 in FIG. 3.

FIG. 3 is a plan view after a first patterning process of the TFT-LCD array substrate according to the first embodiment of the invention, in which one pixel region is shown. FIG. 4 is a sectional view taken along line A2-A2 in FIG. 3. Firstly, for example, a gate metal film with a thickness of 500 Å to 4000 Å is deposited on the substrate 1 (such as a glass substrate or a sapphire substrate) by a magnetron sputtering method, a thermal evaporation method or other film formation method. The gate metal film may be formed by a single layer film of Cr, W, Ti, Ta, Mo, Al, Cu and the like or the alloy thereof, or a multi-layer film of the above metal materials. The gate metal film is patterned by a patterning process with a normal mask to form the gate electrode 2 and the gate line 11 on the substrate 1, as shown in FIG. 3 and FIG. 4.

Figure 5:
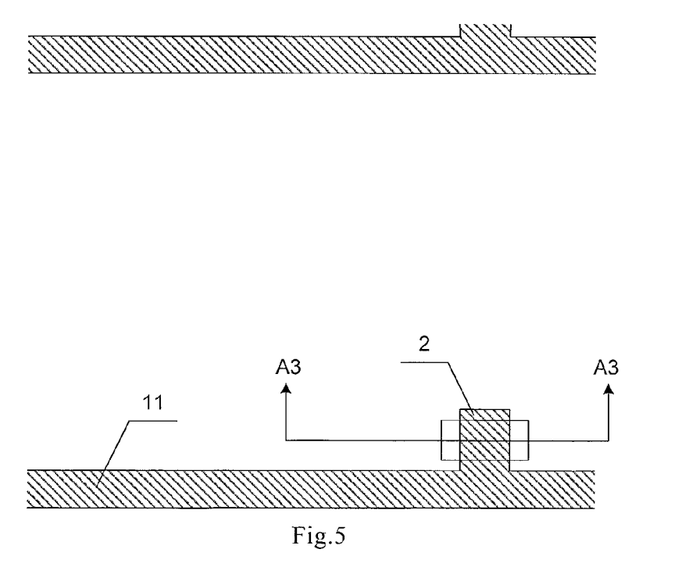
FIG. 5 is a plan view after a second patterning process of the TFT-LCD array substrate according to the first embodiment of the invention.
Figure 6:
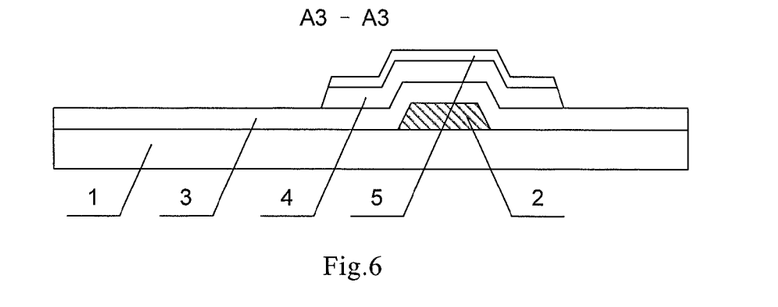
FIG. 6 is a sectional view taken along line A3-A3 in FIG. 5.

FIG. 5 is a plan view after a second patterning process of the TFT-LCD array substrate according to the first embodiment of the invention, in which one pixel region is shown. FIG. 6 is a sectional view taken along line A3-A3 in FIG. 5. On the substrate 1 with the configuration shown in FIG. 3, a gate insulating layer with a thickness of 1000 Å to 4000 Å, a semiconductor film and a doped semiconductor film are sequentially deposited for example by a plasma enhanced chemical vapor deposition (PECVD) method or other film formation method. The semiconductor film and the doped semiconductor film have a total thickness of 1000 Å to 5000 Å. The gate insulating layer may be formed of oxide, nitride or oxynitride, and correspondingly the source gases therefor may be a mixture of $SiH_4$, $NH_3$ and $N_2$ or a mixture of $SiH_2Cl_2$, $NH_3$ and $N_2$. The source gases for the semiconductor film may be a mixture of $SiH_4$ and $H_2$ or a mixture of $SiH_2Cl_2$ and $H_2$. The source gases for the doped semiconductor film may be a mixture of $SiH_4$, $PH_3$ and $H_2$ or a mixture of $SiH_2Cl_2$, $PH_3$ and $H_2$. The semiconductor film and the doped semiconductor film are patterned by a patterning process with a normal mask to form the active layer, as shown in FIG. 5 and FIG. 6. After this patterning process, the gate insulating layer 3 is formed on the gate electrode 2 and the gate line 11 and covers the entirety of the substrate 1, the active layer comprising the stack of the semiconductor layer 4 and the doped semiconductor layer 5 is formed on the insulating layer 3 and positioned over the gate electrode 2.

Figure 7:
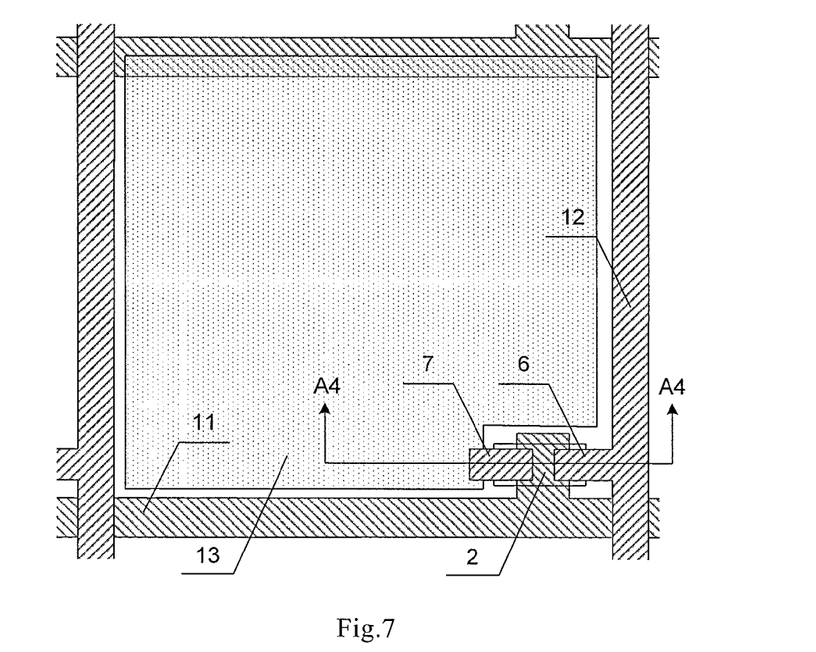
FIG. 7 is a plan view after a third patterning process of the TFT-LCD array substrate according to the first embodiment of the invention.
Figure 8:
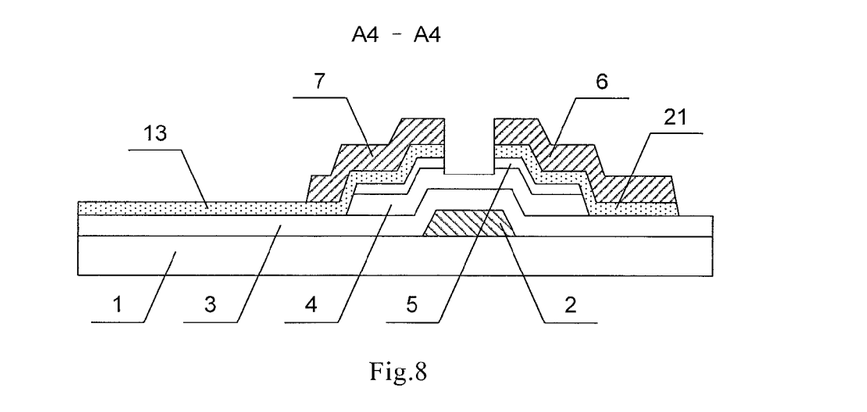
FIG. 8 is a sectional view taken along line A4-A4 in FIG. 7.

FIG. 7 is a plan view after a third patterning process of the TFT-LCD array substrate according to the first embodiment of the invention, in which one pixel region is shown. FIG. 8 is a sectional view taken along line A4-A4 in FIG. 7. On the substrate 1 with the configuration shown in FIG. 5, a transparent conductive film and a source/drain metal film are sequentially deposited. Then, the data line 12, the pixel electrode 13, the source electrode 6 and the drain electrode 7 are formed by a patterning process with a half-tone mask or a gray-tone mask, as shown in FIG. 7 and FIG. 8. Hereinafter, the details of this patterning process are described.

Figure 9:
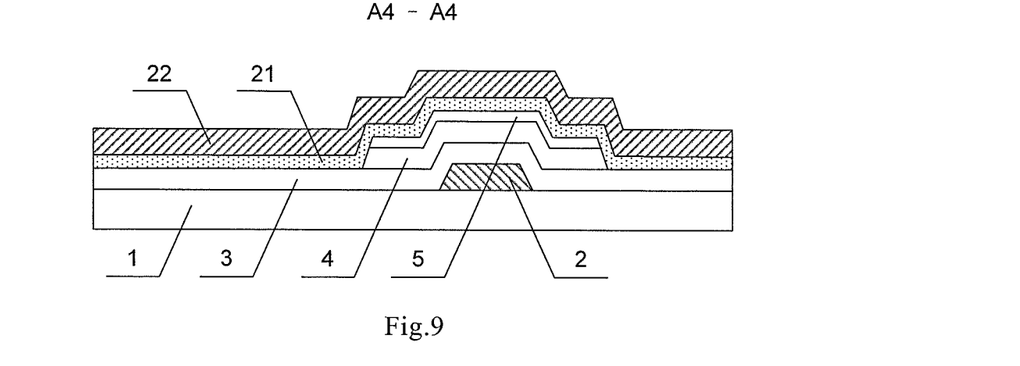
FIG. 9 is a sectional view taken along line A4-A4 after a transparent conductive film and a source/drain metal film are deposited in the third patterning process of the TFT-LCD array substrate according to the first embodiment of the invention.

FIG. 9 is a sectional view taken along line A4-A4 after the transparent conductive film and the source/drain metal film are deposited in the third patterning process of the TFT-LCD array substrate according to the first embodiment of the invention. On the substrate 1 with the configuration shown in FIG. 5, the transparent conductive film 21 with a thickness of 300 Å to 600 Å and the source/drain metal film 22 with a thickness of 2000 Å to 3000 Å are sequentially deposited by a magnetron sputtering method, a thermal evaporation method or other film formation method, as shown in FIG. 9. The transparent conductive film 21 may be formed of indium tin oxide (ITO), indium zinc oxide (IZO), aluminum zinc oxide (AZO) and the like or other transparent metals and metal oxides. The source/drain metal film 22 may be formed by a single layer film of Cr, W, Ti, Ta, Mo, Al, Cu and the like or the alloys thereof, or a multi-layer film of the above metal materials.

Figure 10:
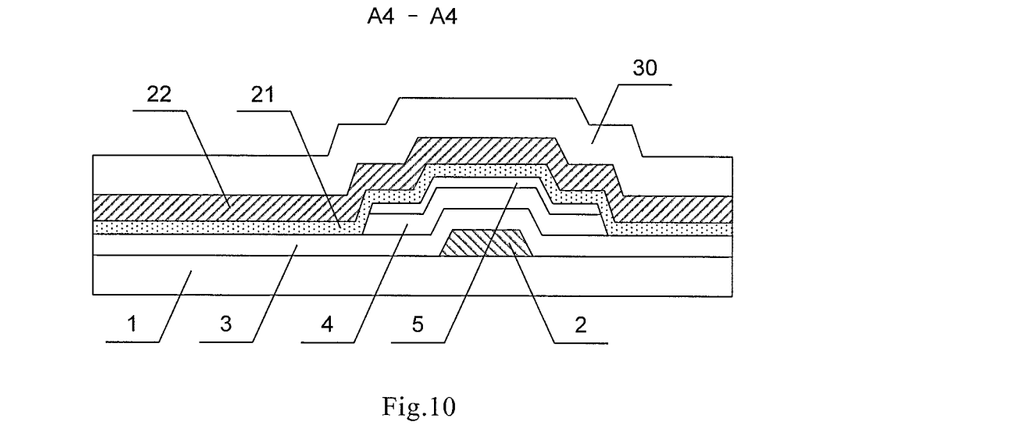
FIG. 10 is a sectional view taken along line A4-A4 after a photoresist layer is applied in the third patterning process of the TFT-LCD array substrate according to the first embodiment of the invention.

FIG. 10 is a sectional view taken along line A4-A4 after a photoresist layer is applied in the third patterning process of the TFT-LCD array substrate according to the first embodiment of the invention. On the substrate 1 with the configuration shown in FIG. 9, a photoresist layer 30 is applied on the source/drain metal film 22, as shown in FIG. 10.

Figure 11:
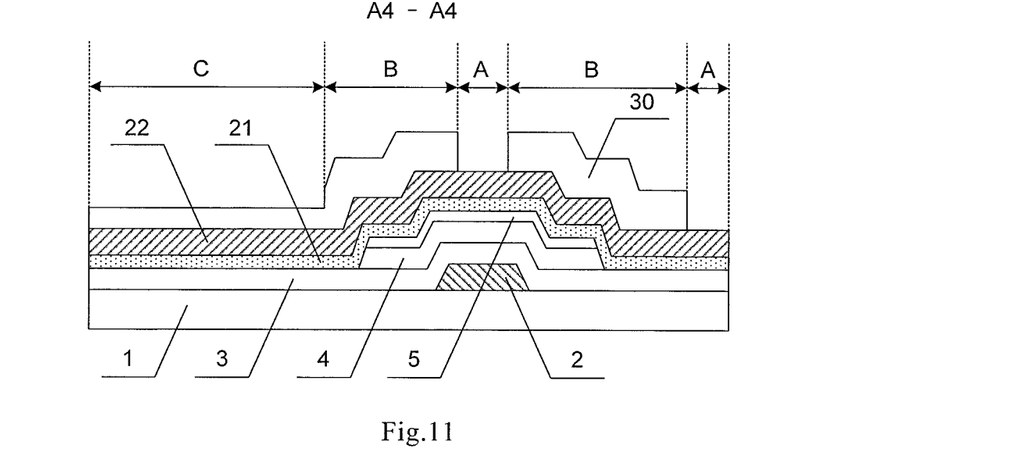
FIG. 11 is a sectional view taken along line A4-A4 after the photoresist layer is exposed and developed in the third patterning process of the TFT-LCD array substrate according to the first embodiment of the invention.

FIG. 11 is a sectional view taken along line A4-A4 after the photoresist layer is exposed and developed in the third patterning process of the TFT-LCD array substrate according to the first embodiment of the invention. The photoresist layer 30 is exposed by a half-tone mask or a gray-tone mask to form a completely exposed region A, an unexposed region B and a partially exposed region C. The unexposed region B corresponds to the region where the data line, the source electrode and the drain electrode are to be formed, the partially exposed region C corresponds to the region where the pixel electrode is to be formed, and the completely exposed region A corresponds to the region other than the above regions. After a developing process is performed, the thickness of the photoresist layer in the unexposed region B is substantially not changed so that a photoresist-completely-retained region is formed, the photoresist layer in the completely exposed region A is completely removed so that a photoresist-completely-removed region is formed, and the thickness of the photoresist layer in the partially exposed region C is decreased so that a photoresist-partially-retained region is formed, as shown in FIG. 11.

Figure 12:
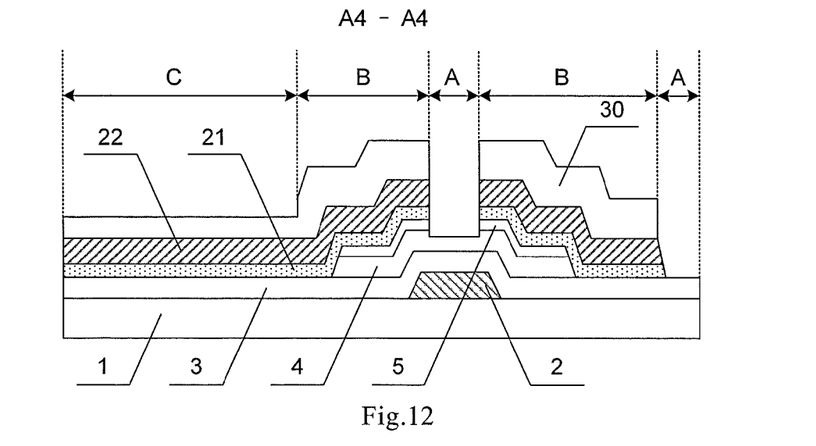
FIG. 12 is a sectional view taken along line A4-A4 after a first etching process in the third patterning process of the TFT-LCD array substrate according to the first embodiment of the invention.

FIG. 12 is a sectional view taken along line A4-A4 after a first etching process in the third patterning process of the TFT-LCD array substrate according to the first embodiment of the invention. By the first etching process, the source/drain metal film 22 and the transparent conductive film 21 in the completely exposed region A is etched away. Next, in the completely exposed region A, the doped semiconductor layer 5 over the gate electrode 2 is etched and then the semiconductor layer 4 is partially etched in the thickness direction thereof so that the TFT channel region is formed, as shown in FIG. 12.

Figure 13:
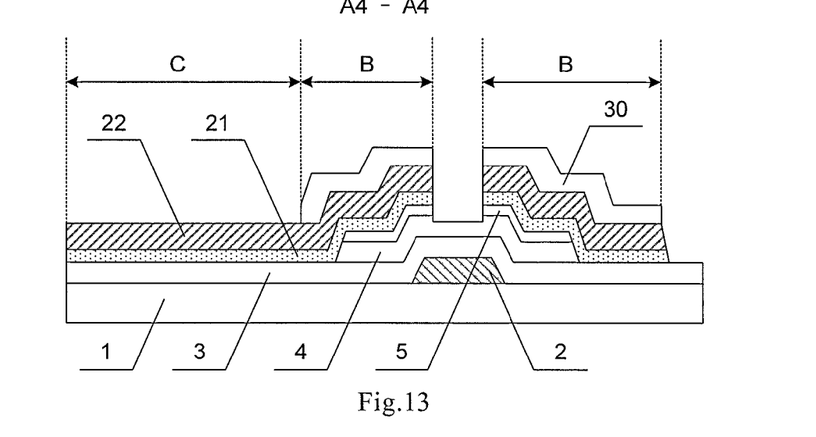
FIG. 13 is a sectional view taken along line A4-A4 after an ashing process in the third patterning process of the TFT-LCD array substrate according to the first embodiment of the invention.

FIG. 13 is a sectional view taken along line A4-A4 after an ashing process in the third patterning process of the TFT-LCD array substrate according to the first embodiment of the invention. By the ashing process, the photoresist layer in the partially exposed region C is removed to expose the source/drain metal film 22 in this region, as shown in FIG. 13. Since the thickness of the photoresist layer in the unexposed region B (the photoresist-completely-retained region) is larger than that in the partially-exposed region C (the photoresist-partially-retained region), the unexposed region B is still covered by the photoresist layer with a decreased thickness after the ashing process.

Figure 14:
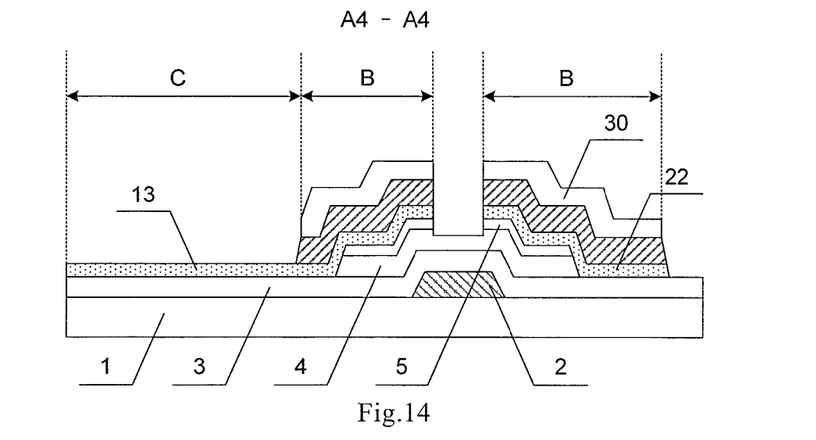
FIG. 14 is a sectional view taken along line A4-A4 after a second etching process in the third patterning process of the TFT-LCD array substrate according to the first embodiment of the invention.

FIG. 14 is a sectional view taken along line A4-A4 after a second etching process in the third patterning process of the TFT-LCD array substrate according to the first embodiment of the invention. By the second etching process, the source/drain metal film 22 in the partially exposed region C is etched away to expose the transparent conductive film in this region, and thus the pixel electrode 13 is formed, as shown in FIG. 14. In the second etching process, a wet etching process or a dry etching process may be employed, and only the source/drain metal film is etched while the transparent conductive film is remained by utilizing the etching selectivity between the source/drain metal film and the transparent conductive film. For example, when the source/drain metal film is formed of aluminum (Al) and the transparent conductive film is formed of ITO or IZO, an acidic etching solution can be employed so that only the source/drain metal film is etched away.

Next, the remaining photoresist is removed to complete the third patterning process of this embodiment. After the third patterning process, one end of the source electrode 6 is provided on the active layer (i.e. the stack of the semiconductor layer 4 and the doped semiconductor layer 5), and the other end thereof is connected with the data line 12. One end of the drain electrode 7 is provided on the active layer and opposite to the source electrode 6. The TFT channel region is formed between the source electrode 6 and the drain electrode 7. In the TFT channel region, the doped semiconductor layer 5 is completely etched away and the semiconductor layer 4 is partially etched in the thickness direction thereof so that the semiconductor layer 4 in this region is exposed. The pixel electrode 13 is provided on the gate insulating layer 3, formed in the pixel region and partially overlaps with the gate line 11 so that the pixel electrode 13 and the gate line 11 constitute a storage capacitor, and a structure in which the storage capacitance is provided on the gate line is formed. The pixel electrode 13 and the gate line 11 are used as two plates of the storage capacitor, and the gap between the two plates is merely the thickness of the gate insulating layer 3. In addition, the transparent conductive film 21 is remained beneath the data line 12, the source electrode 6 and the drain electrode 7, the transparent conductive film beneath the drain electrode 7 is integrally formed with the pixel electrode 13, and thus a structure in which the pixel electrode 13 is directly connected with the drain electrode 7 is formed, as shown in FIG. 7 and FIG. 8.

On the substrate 1 with the configuration shown in FIG. 7, a passivation layer and a light-blocking film are deposited sequentially, and a patterning process is performed by using another half-tone mask or gray-tone mask to form the light-blocking layer, the gate pad via hole and the data pad via hole, as shown in FIG. 1 and FIG. 2. In this patterning process, the passivation layer is deposited to a thickness of 700 Å to 2000 Å by a PECVD method or other film formation method. The passivation layer may be fanned by oxide, nitride or oxynitride, and correspondingly the source gases thereof may be a mixture of $SiH_4$, $NH_3$ and $N_2$ or a mixture of $SiH_2Cl_2$, $NH_3$ and $N_2$. The light-blocking film may be formed by a metallic material capable of blocking light (such as Cr) or a nonmetallic material (such as a resins mixed with black particles), and the thickness of the light-blocking film may be 1000 Å to 35000 Å. When the light-blocking film is formed by a metallic material, a magnetron sputtering method, a thermal evaporation method or other film formation method may be employed; when the light-blocking film is formed by a non-metallic material, a PECVD method or other film formation method may be employed.

Figure 15:
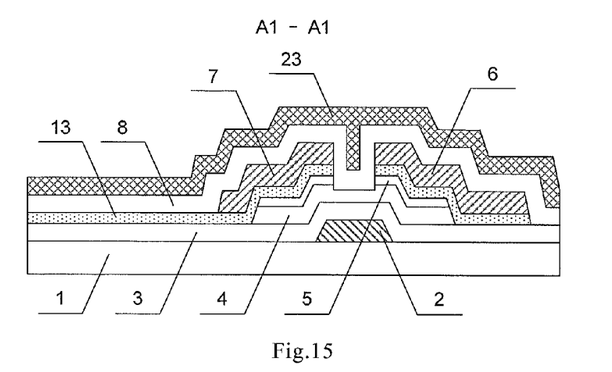
FIG. 15 is a sectional view taken along line A1-A1 after a passivation layer and a light-blocking film are deposited in a fourth patterning process of the TFT-LCD array substrate according to the first embodiment of the invention.
Figure 16:
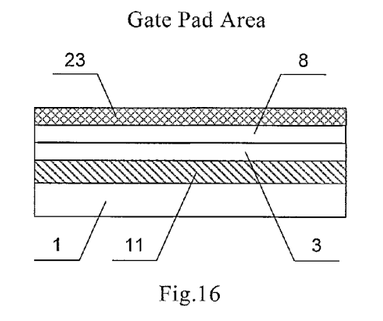
FIG. 16 is a schematic view showing a gate pad region after the passivation layer and the light-blocking film are deposited in the fourth patterning process of the TFT-LCD array substrate according to the first embodiment of the invention.
Figure 17:
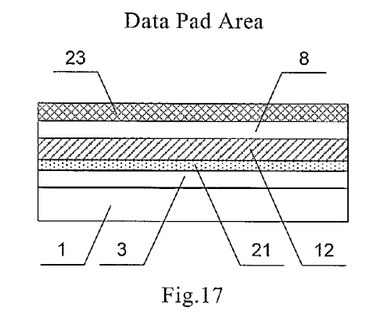
FIG. 17 is a schematic view showing a data pad region after the passivation layer and the light-blocking film are deposited in the fourth patterning process of the TFT-LCD array substrate according to the first embodiment of the invention.

FIG. 15 is a sectional view taken along line A1-A1 after the passivation layer and the light-blocking film are deposited in a fourth patterning process of the TFT-LCD array substrate according to the first embodiment of the invention. FIG. 16 is a schematic view showing the gate pad region after the passivation layer and the light-blocking film are deposited in the fourth patterning process of the TFT-LCD array substrate according to the first embodiment of the invention. FIG. 17 is a schematic view showing a data pad region after the passivation layer and the light-blocking film are deposited in the fourth patterning process of the TFT-LCD array substrate according to the first embodiment of the invention. On the substrate 1 with the configuration shown in FIG. 7, the passivation layer 8 is deposited by a PECVD method or other film formation method, and then the light-blocking film 23 is deposited by a magnetron sputtering method, a thermal evaporation method or other film formation method, as shown in FIG. 15 to FIG. 17.

Figure 18:
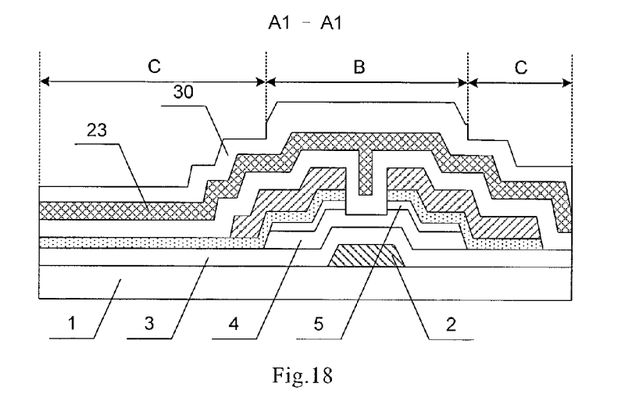
FIG. 18 is a sectional view taken along line A1-A1 after a photoresist layer is exposed and developed in the fourth patterning process of the TFT-LCD array substrate according to the first embodiment of the invention.
Figure 19:
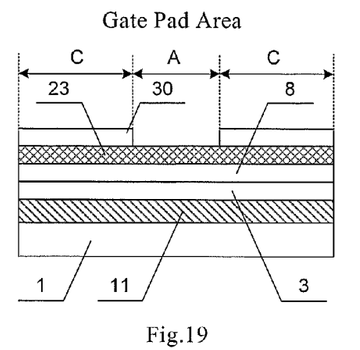
FIG. 19 is a schematic view showing the gate pad region after the photoresist layer is exposed and developed in the fourth patterning process of the TFT-LCD array substrate according to the first embodiment of the invention.
Figure 20:
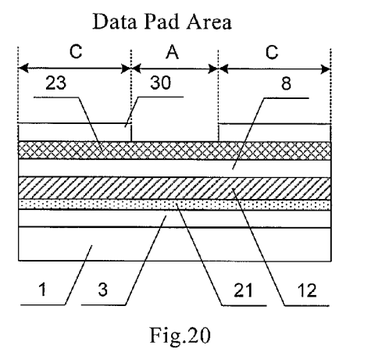
FIG. 20 is a schematic view showing the data pad region after the photoresist layer is exposed and developed in the fourth patterning process of the TFT-LCD array substrate according to the first embodiment of the invention.

FIG. 18 is a sectional view taken along line A1-A1 after a photoresist layer is exposed and developed in the fourth patterning process of the TFT-LCD array substrate according to the first embodiment of the invention. FIG. 19 is a schematic view showing the gate pad region after the photoresist layer is exposed and developed in the fourth patterning process of the TFT-LCD array substrate according to the first embodiment of the invention. FIG. 20 is a schematic view showing the data pad region after the photoresist layer is exposed and developed in the fourth patterning process of the TFT-LCD array substrate according to the first embodiment of the invention.

A photoresist layer 30 is applied on the light-blocking film 23. Then, the photoresist layer 30 is exposed by a using a half-tone mask or a gray-tone mask to form a completely exposed region A, an unexposed region B and a partially exposed region C. The unexposed region B corresponds to the region where the light-blocking layer is to be formed, the completely exposed region A corresponds to the region where the gate pad via hole and the data pad via hole are to be formed, and the partially exposed region C corresponds to the region other than the above regions. After a developing process is performed, the thickness of the photoresist layer in the unexposed region B is substantially not changed so that a photoresist-completely-retained region is formed, the photoresist layer in the completely exposed region A is completely removed so that a photoresist-completely-removed region is formed, and the thickness of the photoresist layer in the partially exposed region C is decreased so that a photoresist-partially-retained region is formed, as shown in FIG. 18 to FIG. 20.

Figure 21:
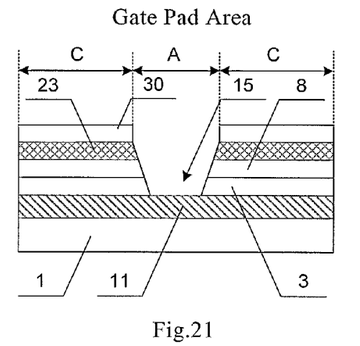
FIG. 21 is a schematic view showing the gate pad region after a first etching process in the fourth patterning process of the TFT-LCD array substrate according to the first embodiment of the invention.
Figure 22:
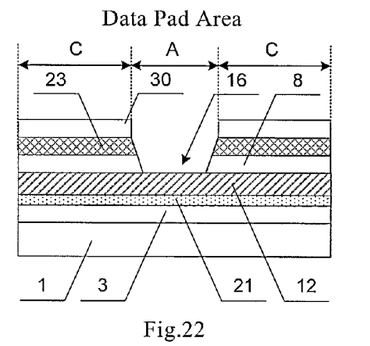
FIG. 22 is a schematic view showing the data pad region after the first etching process in the fourth patterning process of the TFT-LCD array substrate according to the first embodiment of the invention.

FIG. 21 is a schematic view showing the gate pad region after a first etching process in the fourth patterning process of the TFT-LCD array substrate according to the first embodiment of the invention. FIG. 22 is a schematic view showing the data pad region after the first etching process in the fourth patterning process of the TFT-LCD array substrate according to the first embodiment of the invention. With the first etching process, the light-blocking film 23, the passivation layer 8 and the gate insulating layer 3 in the completely exposed region A are etched away in the gate pad region, thus the gate pad via hole 15 is formed and the surface of the gate line 11 is exposed in the gate pad via hole 15; the light-blocking film 23 and the passivation layer 8 in the completely exposed region A are etched away in the data pad region, thus the data pad via hole 16 is formed and the surface of the data line 12 is exposed in the data pad via hole 16, as shown in FIG. 21 and FIG. 22.

Figure 23:
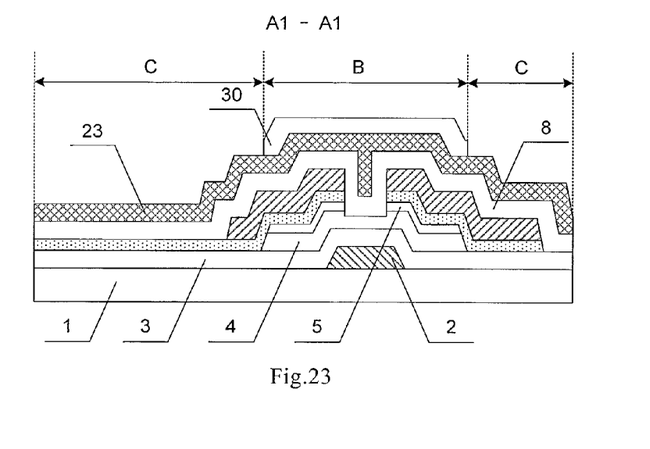
FIG. 23 is a sectional view taken along line A1-A1 after an ashing process in the fourth patterning process of the TFT-LCD array substrate according to the first embodiment of the invention.
Figure 24:
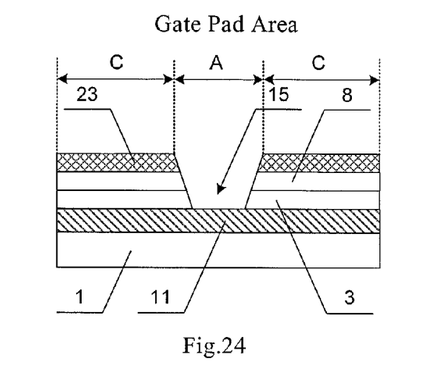
FIG. 24 is a schematic view showing the gate pad region after the ashing process in the fourth patterning process of the TFT-LCD array substrate according to the first embodiment of the invention.
Figure 25:
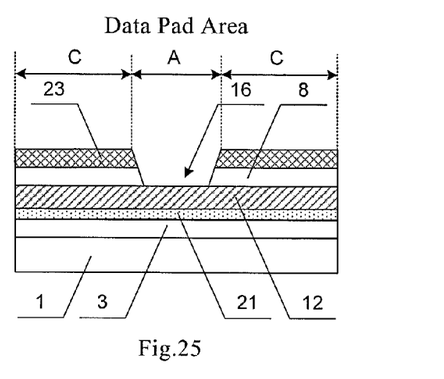
FIG. 25 is a schematic view showing the data pad region after the ashing process in the fourth patterning process of the TFT-LCD array substrate according to the first embodiment of the invention.

FIG. 23 is a sectional view taken along line A1-A1 after an ashing process in the fourth patterning process of the TFT-LCD array substrate according to the first embodiment of the invention. FIG. 24 is a schematic view showing the gate pad region after the ashing process in the fourth patterning process of the TFT-LCD array substrate according to the first embodiment of the invention. FIG. 25 is a schematic view showing the data pad region after the ashing process in the fourth patterning process of the TFT-LCD array substrate according to the first embodiment of the invention. With the ashing process, the photoresist layer in the partially exposed region C is removed to expose the light-blocking film 23 in this region, as shown in FIG. 23 to FIG. 25. Since the thickness of the photoresist layer in the unexposed region B (the photoresist-completely-retained region) is larger than that in the partially-exposed region C (the photoresist-partially-retained region), the unexposed region B is still covered by the photoresist layer with a decreased thickness after the ashing process.

Figure 26:
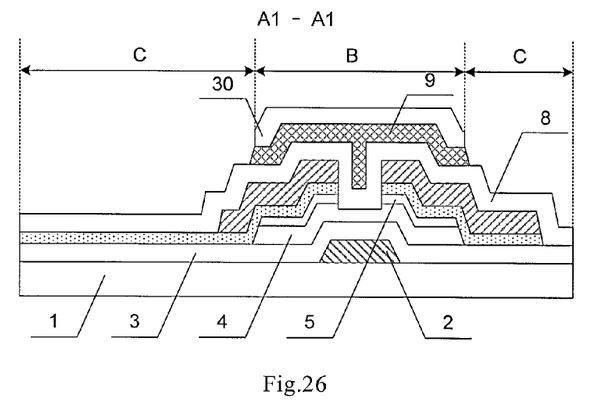
FIG. 26 is a sectional view taken along line A1-A1 after a second etching process in the fourth patterning process of the TFT-LCD array substrate according to the first embodiment of the invention.
Figure 27:
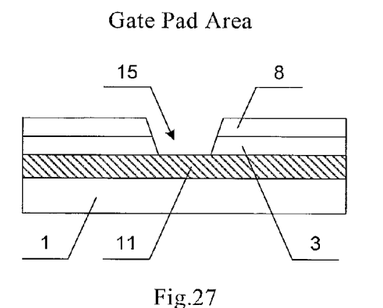
FIG. 27 is a schematic view showing the gate pad region after the second etching process in the fourth patterning process of the TFT-LCD array substrate according to the first embodiment of the invention.
Figure 28:
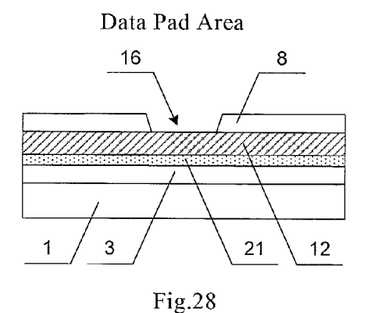
FIG. 28 is a schematic view showing the data pad region after the second etching process in the fourth patterning process of the TFT-LCD array substrate according to the first embodiment of the invention.

FIG. 26 is a sectional view taken along line A1-A1 after a second etching process in the fourth patterning process of the TFT-LCD array substrate according to the first embodiment of the invention. FIG. 27 is a schematic view showing the gate pad region after the second etching process in the fourth patterning process of the TFT-LCD array substrate according to the first embodiment of the invention. FIG. 28 is a schematic view showing the data pad region after the second etching process in the fourth patterning process of the TFT-LCD array substrate according to the first embodiment of the invention. With the second etching process, the light-blocking film 23 in the partially exposed region C is etched away, thus the passivation layer 8 is exposed and the light-blocking layer 9 is formed, as shown in FIG. 26 to FIG. 28.

Next, the remaining photoresist layer is removed to complete the fourth patterning process. After this patterning process, the passivation layer 8 is formed on the source electrode 6, the drain electrode 7, the data line 12 and the pixel electrode 13 and covers the entirety of the substrate 1; the light-blocking layer 9 is formed on the passivation layer 8 and positioned over the TFT channel region so that the light-blocking layer 9 can effectively prevent the light from being irradiated on the TFT channel region and thus the occurrence of the leakage light can be avoided. As shown in FIG. 1 to FIG. 2 and FIG. 27 to FIG. 28, the gate pad via hole 15 is formed in the gate pad region and the gate line 11 is exposed in the gate pad via hole 15; the data pad via hole 16 is formed in the data pad region and the data line 12 is exposed in the data pad via hole 16.

In the TFT-LCD array substrate provided by the above embodiment of the invention, the semiconductor layer in the TFT channel region is prevented from being irradiated by the light, thus the turn-off current $I_{off}$ is decreased, the retention period of the pixel charges is not reduced and the gray level change is not adversely influenced. Therefore, the flickers in the display image can be largely avoided and the display quality can be improved. Furthermore, the gap between two plates of the storage capacitor in the TFT-LCD array substrate of this embodiment is merely the thickness of the gate insulating layer and is relatively small. Thus, the storage capacitance per unit area is increased, which is helpful to improve the aperture ratio and the brightness of the TFT-LCD. In addition, the TFT-LCD array substrate in this embodiment is manufactured by four patterning processes, thus the problems of the leakage current generating in the semiconductor layer and smaller storage capacitance per unit area in the conventional TFT-LCD are solved without increasing the number of the patterning process. Therefore, the TFT-LCD array substrate in the invention has advantageousness over the conventional one.

Figure 29:
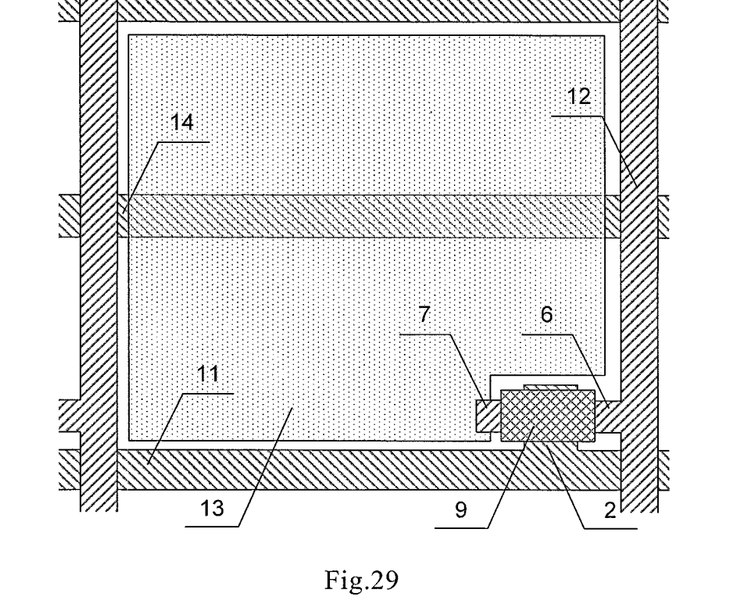
FIG. 29 is a plan view showing a TFT-LCD array substrate according to a second embodiment of the invention.

FIG. 29 is a plan view showing a TFT-LCD array substrate according to a second embodiment of the invention, in which one pixel region is shown. As shown in FIG. 29, the TFT-LCD array substrate in this embodiment is substantially the same as that in the first embodiment, except that the TFT-LCD array substrate in this embodiment further comprises a common electrode line 14 provided in the same layer as the gate line 11. As a result, the common electrode line 14 and the pixel electrode 13 constitute the storage capacitor and a structure in which the storage capacitor is formed on the common electrode line (Cs on common line) is formed. The pixel electrode 13 and the common electrode line 14 are used as two plates of the storage capacitor, and the gap between the two plates is merely the thickness of the gate insulating layer 3.

The manufacture process of the TFT-LCD array substrate in this embodiment is substantially the same as that in the first embodiment except for the first patterning process. Specifically, the first patterning process in this embodiment comprises the following steps: the gate metal film is firstly deposited on the substrate 1 by a magnetron sputtering method, a thermal evaporation method or other film formation method, and then the gate metal film is patterned by a patterning process with a normal mask so that the gate electrode 2, the gate line 11 and the common electrode line 14 are formed on the substrate 1.

Figure 30:
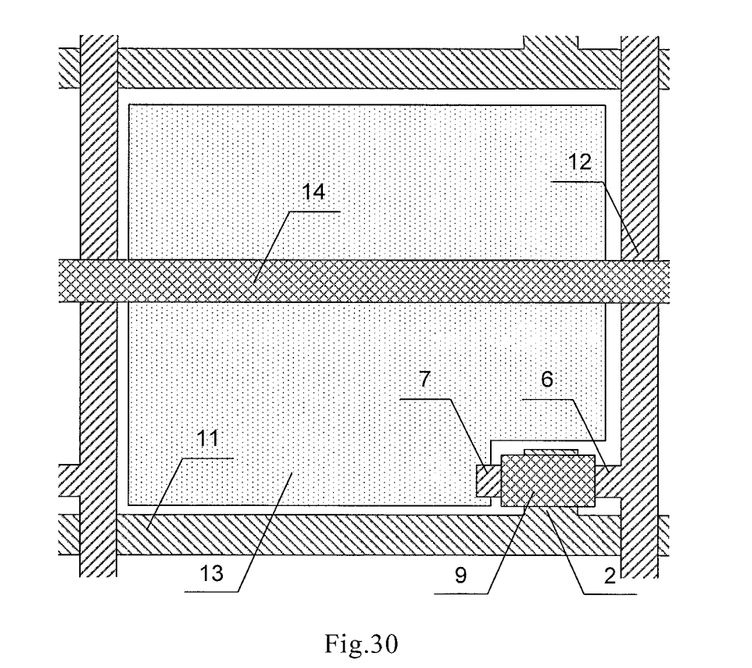
FIG. 30 is a plan view showing a TFT-LCD array substrate according to a third embodiment of the invention.

FIG. 30 is a plan view showing a TFT-LCD array substrate according to a third embodiment of the invention, in which one pixel region is shown. As shown in FIG. 30, the TFT-LCD array substrate in this embodiment is substantially the same as that in the first embodiment, except that the TFT-LCD array substrate in this embodiment further comprises a common electrode line 14 provided in the same layer as the light-blocking layer 9. As a result, the common electrode line 14 and the pixel electrode 13 constitute the storage capacitor and a structure in which the storage capacitor is formed on the common electrode line (Cs on common line) is formed. The pixel electrode 13 and the common electrode line 14 are used as two plates of the storage capacitor, and the gap between the two plates is merely the thickness of the passivation layer 8.

The manufacture process of the TFT-LCD array substrate in this embodiment is substantially the same as that in the first embodiment except for the fourth patterning process. Specifically, the fourth patterning process in this embodiment is performed as follows. The passivation layer is firstly deposited by a PECVD method or other film formation method, then the light-blocking film is deposited by a magnetron sputtering method, a thermal evaporation method or other film formation method, and the photoresist layer is applied on the light-blocking film. The photoresist layer is exposed by using a half-tone mask or a gray-tone mask to form the completely exposed region, the unexposed region and the partially exposed region. The unexposed region corresponds to the region where the light-blocking layer and the common electrode line are to be formed, the completely exposed region corresponds to the region where the gate pad via hole and the data pad via hole are formed, and the partially exposed region corresponds to the region other than the above regions. After a developing process is performed, the thickness of the photoresist layer in the unexposed region substantially is not changed so that a photoresist-completely-retained region is formed, the photoresist layer in the completely exposed region is completely removed so that a photoresist-completely-removed region is formed, and the thickness of the photoresist layer in the partially exposed region is decreased so that a photoresist-partially-retained region is formed. With the first etching process, the light-blocking film, the passivation layer and the gate insulating layer of the completely exposed region are etched away in the gate pad region to form the gate pad via hole, and the surface of the gate line is exposed in the gate pad via hole; the light-blocking film and the passivation layer of the completely exposed region are etched away in the data pad region to form the data pad via hole, and the surface of the data line is exposed in the data pad via hole. With the aching process, the photoresist in the partially exposed region is removed to expose the light-blocking film in this region. With the second etching process, the light-blocking film in the partially exposed region is etched away to expose the passivation layer, and thus the light-blocking layer and the common electrode line are formed. Next, the remaining photoresist layer is removed to complete the fourth patterning process. It should be noted that, since the light-blocking layer and the common electrode line in this embodiment are simultaneously formed, the light-blocking film is formed only by a metallic material.

In addition, the second embodiment and the third embodiment are combinable with the first embodiment to further provide other embodiments, that is, the pixel electrode and the common electrode line constitute the storage capacitor together with the gate line, respectively.

An embodiment of the method of manufacturing a TFT-LCD array substrate according to the invention may comprises the following steps:

Step 1 of forming a gate metal film on a substrate, and forming a gate line and a gate electrode by a patterning process;

Step 2 of sequentially depositing a gate insulating film, a semiconductor film and a doped semiconductor film on the substrate after step 1, and forming an active layer by a patterning process;

Step 3 of sequentially depositing a transparent conductive film and a source/drain metal film on the substrate after Step 2, and forming a pixel electrode, a data line, a source electrode, a drain electrode and a TFT channel region by a patterning process with a half-tone mask or a gray-tone mask, wherein the pixel electrode is directly connected with the drain electrode; and Step 4 of depositing a passivation layer and a light-blocking film on the substrate after Step 3, and forming a light-blocking layer, a gate pad via hole and a data pad via hole by a patterning process with a half-tone mask or a gray-tone mask, wherein the light-blocking layer is positioned over the TFT channel region.

According to the method of manufacturing the TFT-LCD array substrate provided in the invention, the gate line and the gate electrode are formed by a first patterning process; the active layer is formed by a second patterning process; the pixel electrode, the data line, the source electrode, the drain electrode and the TFT channel region are formed by a third patterning process; and the light-blocking layer, the gate pad via hole and the data pad via hole are formed by a fourth patterning process. By forming the light-blocking layer over the TFT channel region, the semiconductor layer in the TFT channel region is prevented from being irradiated by the light, thus the turn-off current $I_{off}$ can be decreased, the retention period of the pixel charges is not reduced and the gray level change is not adversely influenced. Therefore, the flickers in the display image can be largely avoided and the display quality can be improved. Furthermore, the gap between two plates of the storage capacitor in the TFT-LCD array substrate of this embodiment is merely the thickness of the gate insulating layer and is relatively small. Thus, the storage capacitance per unit area is increased, which is helpful to improve the aperture ratio and the brightness of the TFT-LCD. In addition, the method of manufacturing the TFT-LCD array substrate in this embodiment is accomplished with four patterning processes, thus the problems of the leakage current generating in the semiconductor layer and smaller storage capacitance per unit area in the conventional TFT-LCD can be solved without increasing the number of the patterning process. Therefore, the method of manufacturing the TFT-LCD array substrate in the invention has advantageousness over the conventional one.

In a first example of the embodiment of the method of manufacturing the TFT-LCD array substrate according to the invention, the Step 1 may comprise the following steps:

Step 11 of depositing the gate metal film on the substrate; and

Step 12 of patterning the gate metal film by a patterning process with a normal mask to form the gate electrode and the gate line.

In this example, the gate electrode and the gate line are formed by a patterning process with a normal mask. The details of the process in this example have been described with reference to FIG. 3 and FIG. 4 and are omitted here for simplicity.

In a second example of the embodiment of the method of manufacturing the TFT-LCD array substrate according to the invention, the Step 1 may comprise the following steps:

Step 21 of depositing the gate metal film on the substrate;

Step 22 of patterning the gate metal film by a patterning process with a normal mask to form the gate line, the gate electrode and a common electrode line.

In this example, the gate electrode, the gate line and the common electrode line are formed by a patterning process with a normal mask. The details of the process in this example are substantially the same as that in the first example, except that the common electrode line is additionally formed.

In a third example of the embodiment of the method of manufacturing the TFT-LCD array substrate according to the invention, the Step 2 may comprise the following steps:

Step 31 of sequentially depositing the gate insulating layer, the semiconductor layer and the doped semiconductor layer on the substrate after step 2;

Step 32 of patterning the semiconductor layer and the doped semiconductor layer by a patterning process with a normal mask to form the active layer, wherein the active layer is provided on the gate insulating layer and positioned over the gate electrode.

In this example, the active layer is formed by a patterning process with a normal mask. The details of the process in this example have been described with reference to FIG. 5 and FIG. 6 and are omitted here for simplicity.

In a fourth example of the embodiment of the method of manufacturing the TFT-LCD array substrate according to the invention, the Step 3 may comprise the following steps:

Step 41 of sequentially depositing the transparent conductive film and the source/drain metal film on the substrate after the Step 2;

Step 42 of applying a photoresist layer on the source/drain metal film;

Step 43 of exposing the photoresist layer with a half-tone mask or a gray-tone mask to form a photoresist-completely-removed region, a photoresist-completely-retained region and a photoresist-partially-retained region, wherein the photoresist-completely-retained region corresponds to the region where the data line, the source electrode and the drain electrode are to be formed, the photoresist-partially-retained region corresponds to the region where the pixel electrode is to be formed, and the photoresist-completely-removed region corresponds to the region other than the above regions, and wherein after a developing process is performed, the thickness of the photoresist layer in the photoresist-completely-retained is not changed, the photoresist layer in the photoresist-completely-removed region is removed, and the thickness of the photoresist layer in the photoresist-partially-retained region is decreased;

Step 44 of removing the source/drain metal film and the transparent conductive film in the photoresist-completely-removed region, removing the doped semiconductor layer provided over the gate electrode in the photoresist-completely-removed region and partially etching the semiconductor layer in the thickness direction thereof in the photoresist-completely-removed region by a first etching process;

Step 45 of removing the photoresist layer in the photoresist-partially-retained region by an ashing process to expose the source/drain metal film in the photoresist-partially-retained region;

Step 46 of removing the source/drain metal film in the photoresist-partially-retained region by a second etching process to form the pixel electrode, the data line, the source electrode, the drain electrode and the TFT channel region, wherein the pixel electrode is directly connected with the drain electrode;

Step 47 of removing the remaining photoresist layer.

In this example, the pixel electrode, the data line, the source electrode, the drain electrode and the TFT channel region are simultaneously formed by one patterning process with multiple etching steps. The details of the process in this example have been described with reference to FIG. 7 to FIG. 14, and are omitted here for simplicity. It should be noted that the pixel electrode in this example may partially overlap with the gate line or not overlap with the gate line.

In a fifth example of the embodiment of the method of manufacturing the TFT-LCD array substrate according to the invention, the Step 4 may comprise the following steps:

Step 51 of depositing the passivation layer and the light-blocking film on the substrate after Step 3;

Step 52 of applying a photoresist layer on the light-blocking film;

Step 53 of exposing the photoresist layer with a half-tone mask or a gray-tone mask to form a photoresist-completely-removed region, a photoresist-completely-retained region and a photoresist-partially-retained region, wherein the photoresist-completely-retained region corresponds to the region where the light-blocking layer is to be formed, the photoresist-completely-removed region corresponds to the region where the gate pad via hole and the data pad via hole are to be formed, and the photoresist-partially-retained region corresponds to the region other than the above regions; and wherein after a developing process is performed, the thickness of the photoresist layer in the photoresist-completely-retained is not changed, the photoresist layer in the photoresist-completely-removed region is removed, and the thickness of the photoresist layer in the photoresist-partially-retained region is decreased;

Step 54 of removing the light-blocking film, the passivation layer and the gate insulating layer of the photoresist-completely-removed region in a gate pad region and removing the light-blocking film and the passivation layer of the photoresist-completely-removed region in a data pad region by a first etching process to form the gate pad via hole and the data pad via hole;

Step 55 of removing the photoresist layer in the photoresist-partially-retained region by an ashing process to expose the light-blocking film in the photoresist-partially-retained region;

Step 56 of removing the light-blocking film in the photoresist-partially-retained region by a second etching process to form the light-blocking layer, wherein the light-blocking layer is positioned over the TFT channel region;

Step 57 of removing the remaining photoresist layer.

In this example, the light-blocking layer, the gate pad via hole and the data pad via hole are simultaneously formed by one patterning process with multiple etching steps. The details of the process in this example have been described with reference to FIG. 15 to FIG. 28, and are omitted here for simplicity.

In a sixth example of the embodiment of the method of manufacturing the TFT-LCD array substrate according to the invention, the Step 4 may comprise the following steps:

Step 61 of depositing the passivation layer and the light-blocking film on the substrate after Step 3;

Step 62 of applying a photoresist layer on the light-blocking film;

Step 63 of exposing the photoresist layer with a half-tone mask or a gray-tone mask to form a photoresist-completely-removed region, a photoresist-completely-retained region and a photoresist-partially-retained region, wherein the photoresist-completely-retained region corresponds to the region where the light-blocking layer and a common electrode line are to be formed, the photoresist-completely-removed region corresponds to the region where the gate pad via hole and the data pad via hole are to be formed, and the photoresist-partially-retained region corresponds to the region other than the above regions; and wherein after a developing process is performed, the thickness of the photoresist layer in the photoresist-completely-retained is not changed, the photoresist layer in the photoresist-completely-removed region is removed, and the thickness of the photoresist layer in the photoresist-partially-retained region is decreased;

Step 64 of removing the light-blocking film, the passivation layer and the gate insulating layer of the photoresist-completely-removed region in a gate pad region and removing the light-blocking film and the passivation layer of the photoresist-completely-removed region in a data pad region by a first etching process to form the gate pad via hole and the data pad via hole;

Step 65 of removing the photoresist layer in the photoresist-partially-retained region by an ashing process to expose the light-blocking film in the photoresist-partially-retained region;

Step 66 of removing the light-blocking film in the photoresist-partially-retained region by a second etching process to form the light-blocking layer and the common electrode line, wherein the light-blocking layer is positioned over the TFT channel region;

Step 67 of removing the remaining photoresist layer.

The details of the process in this example are substantially the same as those in the fifth example, except that the common electrode line is additionally formed.

In practice, the first example to the sixth example of the method of manufacturing the TFT-LCD array substrate according to the invention may be combined depending on the actual requirements to obtain required technical solutions.

It should be appreciated that the embodiments described above are intended to illustrate but not limit the present invention. Although the present invention has been described in detail herein with reference to the preferred embodiments, it should be understood by those skilled in the art that the present invention can be modified and some of the technical features can be equivalently substituted without departing from the spirit and scope of the present invention.

What is claimed is:

1. A thin film transistor liquid crystal display (TFT-LCD) array substrate, comprising a gate line and a data line, and a pixel electrode and a thin film transistor (TFT), which are formed in a pixel region defined by intersecting of the gate line and the data line, wherein the array substrate further comprises a light-blocking layer, and the light-blocking layer is formed over a TFT channel region of the thin film transistor, and wherein a transparent conductive film is formed beneath the source electrode and the drain electrode, and the transparent conductive film beneath the drain electrode is integrally formed with the pixel electrode so that the pixel electrode is directly connected with the drain electrode.

2. The TFT-LCD array substrate according to claim 1, wherein the array substrate further comprises a common electrode line, the common electrode line constitutes a storage capacitor with the pixel electrode in the pixel region.

3. The TFT-LCD array substrate according to claim 2, wherein the common electrode line is provided in the same layer as the gate line.

4. The TFT-LCD array substrate according to claim 2, wherein the common electrode line is provided in the same layer as the light-blocking layer.

5. The TFT-LCD array substrate according to claim 1, wherein the array substrate further comprises a common electrode line, the common electrode line constitutes a storage capacitor with the pixel electrode in the pixel region.

6. The TFT-LCD array substrate according to claim 5, wherein the common electrode line is provided in the same layer as the gate line.

7. The TFT-LCD array substrate according to claim 5, wherein the common electrode line is provided in the same layer as the light-blocking layer.

* * * * *